United States Patent
Kim et al.

(10) Patent No.: US 10,680,176 B2
(45) Date of Patent: Jun. 9, 2020

(54) METHOD OF FORMING HYBRID NANOSTRUCTURE ON GRAPHENE, HYBRID NANOSTRUCTURE, AND DEVICE INCLUDING THE HYBRID NANOSTRUCTURE

(71) Applicant: SAMSUNG ELECTRONICS CO., LTD., Suwon-si, Gyeonggi-do (KR)

(72) Inventors: Sang-woo Kim, Seoul (KR); Hyun-kyu Park, Seoul (KR)

(73) Assignee: SAMSUNG ELECTRONICS CO., LTD, Gyeonggi-Do (KR)

( * ) Notice: Subject to any disclaimer, the term of this patent is extended or adjusted under 35 U.S.C. 154(b) by 0 days.

(21) Appl. No.: 13/710,549

(22) Filed: Dec. 11, 2012

(65) Prior Publication Data

US 2013/0153860 A1 Jun. 20, 2013

(30) Foreign Application Priority Data

Dec. 16, 2011 (KR) ........................ 10-2011-0136555

(51) Int. Cl.
*H01L 51/00* (2006.01)
*B82Y 10/00* (2011.01)
(Continued)

(52) U.S. Cl.
CPC .......... *H01L 51/0002* (2013.01); *B82Y 10/00* (2013.01); *B82Y 30/00* (2013.01); *B82Y 40/00* (2013.01); *C01B 32/186* (2017.08); *C01B 32/194* (2017.08); *H01L 21/0237* (2013.01); *H01L 21/0259* (2013.01); *H01L 21/0262* (2013.01); *H01L 21/02444* (2013.01); *H01L 21/02491* (2013.01); *H01L 21/02502* (2013.01);
(Continued)

(58) Field of Classification Search
CPC combination set(s) only.
See application file for complete search history.

(56) References Cited

U.S. PATENT DOCUMENTS

2002/0172820 A1* 11/2002 Majumdar ............. B82Y 10/00
428/357
2003/0089899 A1* 5/2003 Lieber ................... B82Y 10/00
257/9

(Continued)

FOREIGN PATENT DOCUMENTS

| KR | 1020100073972 A | 7/2010 |
| KR | 1020110032999 A | 3/2011 |
| KR | 1020110057989 A | 6/2011 |

OTHER PUBLICATIONS

Brijesh Kumar, Keun Young Lee, Hyun-Kyu Park, Seung Jin Chae, Young Hee Lee, and Sang-Woo Kim, "Controlled Growth of Semiconducting Nanowire, Nanowall, and Hybrid Nanostructures on Graphene for Piezoelectric Nanogenerators", Apr. 15, 2011, American Chemical Society Nano, vol. 5, No. 5, pp. 4197-4204.*

(Continued)

*Primary Examiner* — Cuong B Nguyen
(74) *Attorney, Agent, or Firm* — Cantor Colburn LLP

(57) ABSTRACT

A method of forming a hybrid nanostructure on graphene, the method including providing a graphene layer on a substrate; forming a metal layer on the graphene layer; and chemically depositing a nanomaterial on the graphene layer on which the metal layer is formed to form the hybrid nanostructure.

20 Claims, 8 Drawing Sheets

(51) Int. Cl.
*H01L 29/16* (2006.01)
*H01L 21/02* (2006.01)
*H01L 29/41* (2006.01)
*B82Y 40/00* (2011.01)
*H01L 29/06* (2006.01)
*H01L 31/18* (2006.01)
*B82Y 30/00* (2011.01)
*C01B 32/186* (2017.01)
*C01B 32/194* (2017.01)

(52) U.S. Cl.
CPC .. *H01L 21/02521* (2013.01); *H01L 21/02554* (2013.01); *H01L 21/02603* (2013.01); *H01L 21/02645* (2013.01); *H01L 21/02653* (2013.01); *H01L 29/0676* (2013.01); *H01L 29/1606* (2013.01); *H01L 29/413* (2013.01); *H01L 31/1884* (2013.01); *Y02E 10/50* (2013.01)

(56) References Cited

U.S. PATENT DOCUMENTS

| | | | | |
|---|---|---|---|---|
| 2005/0211154 | A1* | 9/2005 | Alivisatos | G06N 10/00 117/1 |
| 2009/0142558 | A1* | 6/2009 | Jiao | B82Y 30/00 428/206 |
| 2010/0117488 | A1* | 5/2010 | Wang et al. | 310/339 |
| 2011/0050042 | A1* | 3/2011 | Choi et al. | 310/339 |
| 2011/0095653 | A1* | 4/2011 | Lee | H02N 2/18 310/339 |
| 2011/0121264 | A1 | 5/2011 | Choi et al. | |
| 2011/0163636 | A1* | 7/2011 | Sirbuly | B82Y 30/00 310/339 |
| 2011/0180783 | A1* | 7/2011 | Gao | B82Y 10/00 257/15 |
| 2012/0121891 | A1 | 5/2012 | Kim et al. | |

OTHER PUBLICATIONS

Choi, Dukhyun, et al., "Fully Rollable Transparent Nanogenerators Based on Graphene Electrodes," Advanced Materials 2010, vol. 22, pp. 2187-2192.

Kim, Yong-Jin, et al., "Vertically aligned ZnO nanostructures grown on graphene layers," Applied Physics Letters 95, 213101 (2009), pp. 213101-1-213101-3.

Lee, Jung Min, et al., "ZnO Nanorod-Graphene Hybrid Architectures for Multifunctional Conductors," J. Phys. Chem. C, vol. 113, No. 44, 2009, pp. 19134-19138.

Lin, Jian, et al., "Heterogeneous Graphene Nanostructures: Zno Nanostructures Grown on Large-Area Graphene Layers," small 2010, vol. 6, No. 21, pp. 2448-2452.

Korean Office Action for Korean Patent Application No. 10-2011-0136555 dated May 16, 2018.

Li et al., "Large-Area Synthesis of High-Quality and Uniform Graphene Films on Copper Foils", Science, vol. 324, Jun. 5, 2009, p. 1312-1314.

Korean Office Action for Korean Patent Application No. 10-2011-0136555 dated Dec. 20, 2019.

Kumar et al., "Controlled Growth of Semiconducting Nanowire, Nanowall, and Hybrid Nanostructures on Graphene for Piezoelectric Nanogenerators", ACSNANO org, vol. 5, No. 5, 2011, 4197-4202.

* cited by examiner

US 10,680,176 B2

METHOD OF FORMING HYBRID NANOSTRUCTURE ON GRAPHENE, HYBRID NANOSTRUCTURE, AND DEVICE INCLUDING THE HYBRID NANOSTRUCTURE

This application claims priority to Korean Patent Application No. 10-2011-0136555, filed on Dec. 16, 2011, and all the benefits accruing therefrom under 35 U.S.C. § 119, the content of which in its entirety is herein incorporated by reference.

BACKGROUND

1. Field

The present disclosure relates to methods of forming a hybrid nanostructure on graphene, a hybrid nanostructure, and a device including the hybrid nanostructure.

2. Description of the Related Art

Graphene has a single layer structure with a 2-dimensional ("2D") honeycomb-shaped lattice of carbon atoms. Due to its remarkable electronic, optical, chemical, and mechanical characteristics, such as quantum electron transport properties, optical transparency, chemical stability, and mechanical durability, graphene has recently drawn attention for use in nanoscale devices, for example.

Graphene is a promising next-generation transparent conductive material for use instead of a general transparent conductive oxide ("TCO"), such as indium tin oxide ("ITO") or fluorotin oxide ("FTO"), in a photoelectronic device such as a solar cell or a light emitting diode.

However, to apply graphene in a nanoelectronic device an improved method for forming a nanostructure on graphene is needed.

SUMMARY

Provided is a method of forming a hybrid nanostructure on graphene.

Provided is a composite nanostructure including the hybrid nanostructure formed using the above method.

Provided is a nanoelectronic device including the composite nanostructure.

Additional aspects will be set forth in part in the description which follows and, in part, will be apparent from the description, or may be learned by practice of the presented embodiments.

According to an aspect, disclosed is a method of forming a hybrid nanostructure on graphene, the method including: providing a graphene layer on a substrate; forming a metal layer on the graphene layer; and chemically depositing a nanomaterial on the graphene layer on which the metal layer is formed to form the hybrid nanostructure.

The nanomaterial may be a Group IV semiconductor, a Group III-V semiconductor, a Group II-VI semiconductor, a Group IV-VI semiconductor, a Group IV-V-VI semiconductor, an oxide semiconductor, a nitride semiconductor, a metal, or a combination thereof.

The nanomaterial may be chemically deposited for about 30 minutes to about 2 hours at about 800 to about 950° C.

The forming of the graphene layer may include: growing the graphene layer on a metal catalyst layer via chemical deposition; removing the metal catalyst layer from the graphene layer; and transferring the graphene layer to the substrate.

According to another aspect, a composite nanostructure includes: a substrate; a graphene layer disposed on the substrate; and a hybrid nanostructure formed on the graphene layer and including a combination of nanowall and a nanowire.

The hybrid nanostructure may include a nanowall, a combination of a nanowall and a nanowire, and a nanowire in the stated order from the substrate.

According to another aspect, a nanoelectronic device includes the composite nanostructure above.

According to another aspect, disclosed is a hybrid nanostructure including: a nanowall; and a nanowire abutting the nanowall, wherein the nanowall and the nanowire include a Group IV semiconductor, a Group III-V semiconductor, a Group II-VI semiconductor, a Group IV-VI semiconductor, a Group IV-V-VI semiconductor, an oxide semiconductor, a nitride semiconductor, or a combination thereof; and wherein a thickness of the nanowall is about 5 to about 100 nm and a diameter of the nanowire is about 5 to about 100 nm.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
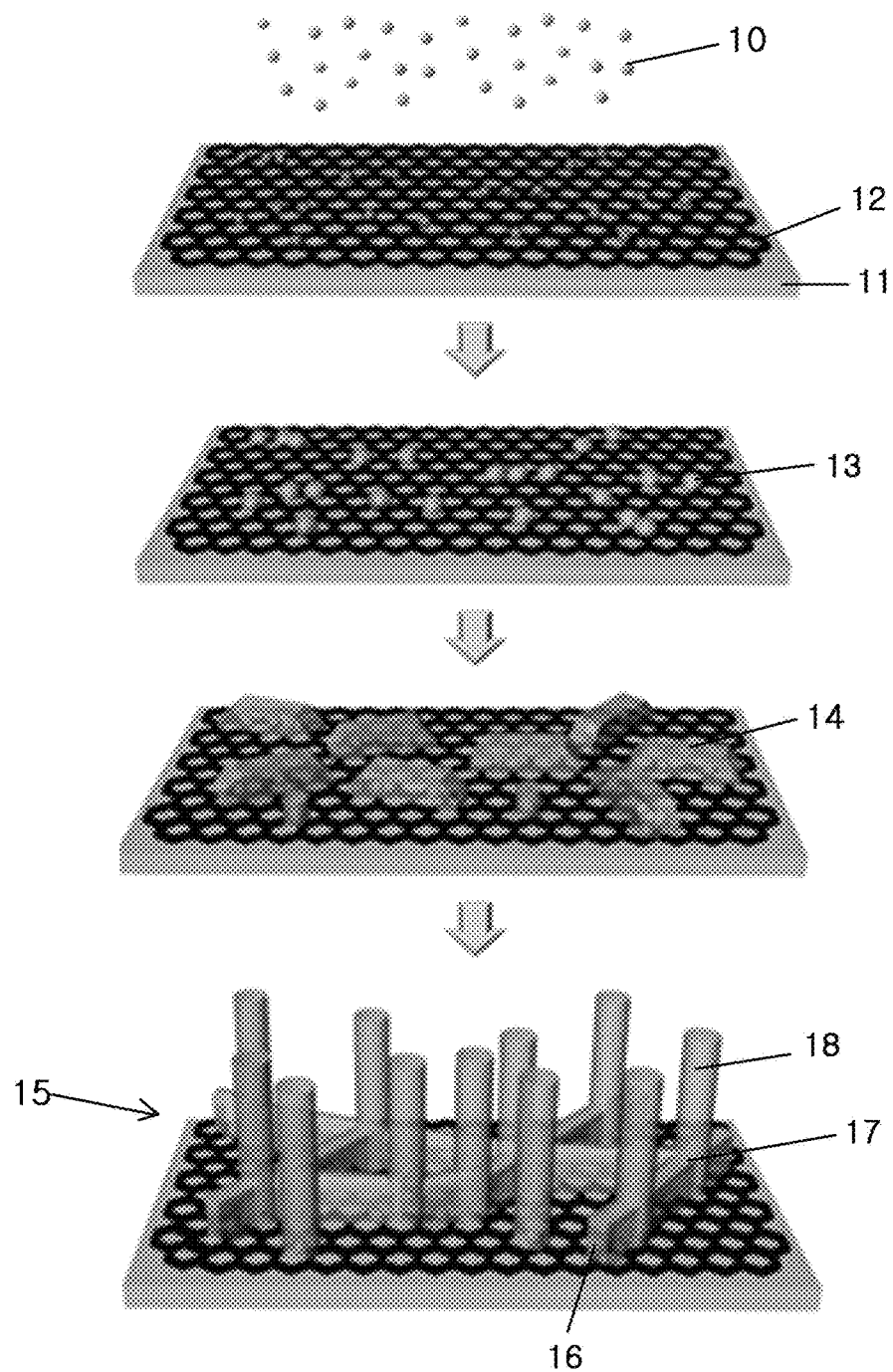
FIG. 1 a diagram schematically illustrating an embodiment of a processes of forming a hybrid nanostructure.

Reference will now be made in detail to embodiments, examples of which are illustrated in the accompanying drawings. This invention may be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A composite nanostructure can be obtained by growing a nanomaterial on a substrate such as ITO, gallium nitride ("GaN"), or aluminum nitride ("AlN"). Such nanostructures have been used as a piezoelectric element. By disposing a graphene layer between the substrate and the nanostructure in the composite nanostructure, an excellent nanoelectronic device that enjoys the benefits of the excellent thermal and mechanical characteristics and excellent conductivity of graphene can be manufactured.

However, it is difficult to control the orientation of the nanostructure formed on the graphene layer, and thus it is difficult to reliably obtain a nanostructure having a suitable quality, for example a nanostructure disposed perpendicular to the graphene layer rather than at an angle with respect to the graphene layer.

Also, nanostructures may have various shapes, such as a nanowire, a nanorod, or a nanotube. Since the electrical properties of a nanostructured piezoelectric element vary according to a shape of the nanostructure, the morphology of the nanostructure is desirably controlled.

A method of forming a hybrid nanostructure on graphene according to an embodiment includes: disposing (e.g., forming) a graphene layer on a substrate; forming a metal layer on the graphene layer, and chemically depositing a nanomaterial on the graphene layer on which the metal layer is formed.

According to an embodiment, a desired hybrid nanostructure may be formed by selecting a thickness of the metal layer, which functions as a catalyst in the growth of the nanomaterial, to a selected thickness in order to effectively select the morphology of a nanostructure.

Herein, a "hybrid nanostructure" means a nanostructure that comprises a combination of shapes, such as a nanowire, a nanotube, a nanorod, or a nanowall, in combination. In an embodiment the hybrid nanostructure comprises a nanowall and a nanowire.

Herein, a "nanowire" has a cylindrical structure and may have a diameter from tens of nanometers (nm) to hundreds of nm, specifically about 10 to about 900 nm, and a length of several micrometers (μm) to tens of μm, specifically about 3 to about 90 μm.

Herein, a "nanowall" has a 3-dimensional ("3D") nanostructure, i.e., a wall shape which has a major surface that is substantially perpendicular to a surface on which the nanowall is disposed. A plurality of nanowalls may be networked to form a honeycomb shape.

The term "graphene" or "graphene sheet" as used herein means a polycyclic aromatic molecule formed from a plurality of carbon atoms which are covalently bound to each other. The graphene is substantially planar. The covalently bound carbon atoms may form a six-membered ring as a repeating unit, and may further include at least one of a five-membered ring and a seven-membered ring. Accordingly, graphene comprises a single layer of covalently bonded carbon atoms having $sp^2$ hybridization. A plurality of graphene layers is often referred to in the art as graphite. However, for convenience, "graphene" as used herein may be a single layer, or also may comprise a plurality of layers of carbon. Thus graphene, as used herein, may have a multiply layered structure formed by stacking single layers of graphene.

FIG. 1 a diagram schematically illustrating an embodiment of a process of forming a hybrid nanostructure. The method will now be described in further detail with reference to FIG. 1.

First, a graphene layer 12 is formed on a substrate 11. The substrate 11 may be a transparent glass substrate, a plastic substrate, a metal oxide substrate, or a combination thereof. The substrate may comprise a polyethylene naphthalate ("PEN"), a silicon oxide (e.g., $SiO_2$), an aluminum oxide (e.g., $Al_2O_3$), or a combination thereof. In an embodiment the substrate consists of PEN, $SiO_2$, or $Al_2O_3$.

Any known method of forming the graphene layer 12 on the substrate 11 may be used. For example, a carbon source may be chemically or physically deposited on (e.g., contacted with) a metal foil used as a graphitization catalyst to form graphene, and then a polymer, such as polymethyl methacrylate ("PMMA"), may be spin coated on a surface of the graphene opposite to a surface where the graphitization catalyst is disposed to transfer the graphene to a substrate. Next, the graphitization catalyst may be removed using an etchant, the graphene on the PMMA may be transferred to the substrate, and then the PMMA may be removed with a solvent.

Any carbon source that comprises carbon and is in a gaseous state at a temperature of 300° C. or above may be used to form the graphene. The gaseous carbon source may be any suitable compound containing carbon, such as a C1-C6 compound, specifically a C2-C4 compound, more specifically a C1-C2 compound. The gaseous carbon source may be a C1-06 hydrocarbon, wherein "hydrocarbon" means an organic compound having at least one carbon atom and at least one hydrogen atom. For example, the gaseous carbon source may comprise, or consist of, carbon monoxide, methane, ethane, ethylene, ethanol, acetylene, propane, propylene, butane, butadiene, pentane, pentene, cyclopentadiene, hexane, cyclohexane, benzene, toluene, or a combination thereof.

The carbon source may be disposed into (e.g., injected into) a chamber at a selected pressure where the graphitization catalyst is present. The chamber may include only the carbon source, or an inert gas, such as helium or argon, may optionally be included with the carbon source.

Also, hydrogen may be used in conjunction with the carbon source. The hydrogen may be used to control a gas phase reaction by maintaining a clean surface on the graphitization catalyst, wherein a content of the hydrogen may be about 5 to about 40 volume %, for example, about 10 to about 30 volume %, or about 15 to about 25 volume %, with respect to a total volume of the chamber.

After injecting the carbon source into the chamber where the graphitization catalyst is present, the chamber is thermally processed at a selected temperature to form the graphene on the surface of the graphitization catalyst. The thermal process is performed so that the graphitization catalyst maintains a film (e.g., planar) shape. A thermal process temperature can determine a quality of the graphene, and the thermal process temperature may be about 300 to about 2000° C., specifically about 500 to about 1500° C., more specifically about 600 to about 1400° C. If the thermal process temperature is within the above range, graphene having a sheet shape may be suitably obtained.

By maintaining the thermal process at a selected temperature for a selected time, an amount of graphene generated may be selected. In other words, if the thermal process is maintained for a longer time, an amount of graphene generated is increased, and thus, a thickness of the graphene may be increased. Alternatively, if the thermal process is shorter, the thickness of the graphene is decreased. Accordingly, in order to obtain the graphene having a desired thickness, a period of time for the thermal process may be suitably selected, in consideration of a type and a supply pressure of the carbon source, a type of the graphitization catalyst, and a size of the chamber. The period of time for maintaining the thermal process may be about 0.001 to about 1000 hours, specifically about 0.01 to about 100 hours, more specifically about 0.1 to about 10 hours, and a desired amount and/or thickness of graphene may be effectively obtained if the period of time is within the above range.

A thermal source for the thermal process may be an induction, radiation, laser, infrared ("IR"), microwave, plasma, ultraviolet ("UV"), or surface plasmon heater, or a combination thereof. The thermal source may be on (e.g., adhered to) the chamber and may increase a temperature inside the chamber to a selected temperature.

After the thermal process, a selected cooling process is performed on the product of the thermal process. The cooling process is performed so that the graphene grows uniformly and is regularly aligned. Since rapid cooling may generate a crack or the like in the graphene, the graphene may be gradually cooled down, if desired. For example, the graphene may be cooled down at a rate of about 10 to about 100° C. per minute (° C./min), specifically about 15 to about 90° C./min, specifically about 20 to about 80° C./min, or may be naturally cooled down. The natural cooling is performed by simply removing the thermal source used for the thermal process, and it can be possible to obtain a suitable cooling rate just by removing the thermal source.

The graphene obtained after the cooling process may have a thickness of about 1 to about 300 layers, for example, from about 1 to about 60 layers, or from about 1 to about 15 layers. As is further noted above, "graphene" as used herein may be a single layer, or may comprise a plurality of layers of carbon.

The thermal and cooling processes may be performed in a single cycle, or by repeatedly performing the thermal and cooling processes, graphene having a larger number of layers and a dense structure may be generated. In an embodiment, the thermal and cooling processes may include about 1 to about 100 cycles, specifically about 2 to about 90 cycles, more specifically about 4 to about 80 cycles.

The graphene layer may be formed using any suitable method, such as by reducing graphene oxide, as well as the chemical deposition method.

A metal layer 13 may be disposed (e.g., formed on) the graphene layer 12 via any suitable method, e.g., thermal evaporation of a metal 10. For example, a thickness of the metal layer 13 may be about 0.5 to about 5 nanometers (nm), specifically about 0.7 to about 4 nm, more specifically about 1 to about 3 nm. The metal may be a Group 10 or Group 11 metal. In an embodiment the metal is Pd, Pt, Au, or a combination thereof. Gold is specifically mentioned.

Then, a hybrid nanostructure 15 is formed by chemically depositing a nanomaterial 14 on the graphene layer 12 on which the metal layer 13 is formed.

According to a general method, a nanomaterial layer is formed directly on a substrate, or the nanomaterial layer may be formed by spin coating a precursor of the nanomaterial on a graphene layer, a nanocore may be formed via heating, and then a nanostructure may be formed by injecting the substrate into a solution in which a precursor of the nanomaterial is dissolved to grow the nanomaterial on the substrate. In the general method, the orientation of the nanostructure may be selected, but it is difficult to select the morphology of the nanostructure.

Also, when a nanostructure is formed by directly growing a nanomaterial on a substrate using a general gold metal layer via a vapor-liquid-solid method, a bond energy between the nanomaterial and the substrate is less than a bond energy between gold and the substrate, and thus the gold moves upward as the nanostructure is formed. When the commercially available gold metal layer is used, since it is difficult to grow a nanowire on the substrate in a direction perpendicular to the substrate, it is difficult to obtain a nanoelectronic device having suitably stable electrical characteristics.

However, according to an embodiment, the hybrid nanostructure 15 having a desired morphology is obtained by forming and growing the nanomaterial 14 on the graphene layer 12 via chemical deposition using the metal layer 13 as a catalyst. The hybrid nanostructure 15 may include various structures, including a nanowall 16, a combination 17 of a nanowall and a nanowire, or a nanowire 18. In an embodiment, the nanostructure 15 comprises a nanowall 16, a combination 17 of a nanowall and a nanowire, and a nanowire 18 in the stated order from the substrate 11. In another embodiment, a picket fence structure, a post-and-beam structure, or a post-and-lintel structure, each comprising a nanowire connected by a nanowall, may be provided. In an embodiment the nanowire may extend from the surface of the graphene, or the nanowire may extend from a surface of the nanowall, e.g., a structure in which the nanowire is disposed on the nanowall.

The nanowall may have a thickness of about 5 to about 100 nm, specifically about 10 to about 80 nm, more specifically about 15 to about 60 nm, wherein the thickness is in a direction parallel to the surface of the graphene and transverse to a longitudinal direction of the nanowall. Also, the nanowall may have a height of about 1 to about 100 μm, specifically about 5 to about 80 μm, more specifically about 10 to about 60 nm, wherein the height is in a direction perpendicular to the surface of the graphene.

The nanowire may have a length of about 1 to about 100 μm, specifically about 5 to about 80 μm, more specifically about 10 to about 60 nm, wherein the length is in a direction perpendicular to the surface of the graphene. Also, the nanowire may have a diameter of about 5 to about 100 nm, specifically about 10 to about 80 nm, more specifically about 15 to about 60 nm, wherein the diameter is in a direction parallel to the surface of the graphene and transverse to a longitudinal direction of the nanowire.

In an embodiment, a nanomaterial may grow in a nanowall shape on a metal layer, e.g., a gold metal layer, and as a distance between the metal layer and the nanomaterial increases, a nanowire may start to grow, and thus a nanowire may be formed. Moreover, the nanowire may be arranged substantially or completely perpendicular to a surface of a graphene. In an embodiment, an angle between a longitudinal direction of the nanowire and a surface of the graphene may be about 80 to about 100 degrees (°), specifically about 85 to about 95°, more specifically about 87 to about 93°. An embodiment in which an average longitudinal direction of a plurality of nanowires and the surface of the graphene is about 90° is specifically mentioned.

For example, in an embodiment of a method of growing a nanomaterial, a nanomaterial may be formed and grown by disposing a substrate, on which a graphene layer including a metal layer is formed, in a chamber, and chemically depositing an oxide, e.g., zinc oxide, or a nitride and graphite powder on the graphene layer under an atmosphere of inert gas. The oxide or nitride may comprise gallium nitride (GaN), vanadium oxide ($VO_2$), stannous oxide ($SnO_2$), cadmium sulfide (CdS), cadmium selenide (CdSe), or titanium oxide ($TiO_2$), or a combination thereof. The oxide or nitride may be selected according to a type of the nanomaterial to be formed on the graphene layer via chemical deposition. The chemical deposition may be performed for about 30 minutes to about 2 hours, specifically about 40 minutes to about 1.8 hours, more specifically about 50 minutes to about 1.6 hours at about 800 to about 950° C., specifically about 820 to about 930° C., more specifically about 840 to about 910° C.

During the chemical deposition, the metal layer forms an island structure when heated, and the nanomaterial is formed as the island structure functions as a core forming site. In other words, when heat is applied to the metal layer, the metal layer changes into a globular island shape to reduce surface energy. For example, a gold metal thin film deposited in a thickness of about 1 to 10 nm changes into an island shape at a temperature from about 350 to about 800° C. Also, when the thickness of the metal layer is increased, a size and density of the island structure are increased. A hybrid nanostructure may be formed on the metal layer having the island structure. A nanowall and a nanowire are combined in the hybrid nanostructure, wherein a nanowall, a combination of a nanowall and a nanowire, and a nanowire are arranged in the stated order from the graphene layer.

If a nanomaterial is directly grown on a substrate according to a commercially available technology, the substrate may be damaged due to a high growth temperature. According to an embodiment, a buffer layer of a graphene layer may be provided on a substrate, and thus the substrate may not be damaged.

Also, if a nanomaterial is grown on a graphene layer as disclosed in an embodiment, a bond energy between a metal, e.g., gold, and graphene is less than a bond energy between the nanomaterial and the graphene, and thus the metal and the graphene may be covalently bonded. Thus, the nanostructure may be stably formed. Also, if the metal is gold, an optical device may be satisfactorily formed according to a surface plasmon effect due to the existence of the gold.

A method of manufacturing a hybrid nanostructure by selecting a thickness of a metal layer will now be further described, but the embodiments are not limited thereto.

A diffusion coefficient D of the metal particles forming an island structure may be expressed by Equation 1 below.

Equation 1

$$D \propto \exp\left(-\frac{E_a}{K_b T}\right) \quad (1)$$

As is provided in Equation 1, the diffusion coefficient D is related to activation energy $E_a$, which is an energy sufficient for the metal atoms to diffuse.

When a range of a chemical deposition temperature of the nanomaterial is selected to be about 800 to about 950° C., specifically about 820 to about 930° C., more specifically about 840 to about 910° C., diffusion of the metal atoms (e.g., gold atoms) to the surface of graphene is suppressed, and thus carbon atoms and the metal may form a strong covalent bond in a network of the graphene. Also, the morphology of the nanostructure formed thereon is also controlled according to a magnitude of the diffusion coefficient D, and thus, the hybrid nanostructure may be formed. Specifically, when the chemical deposition is performed in the above temperature range, the nanowall is formed on the metal particles up to a selected height, and then the combination of the nanowall and the nanowire, and the nanowire, are sequentially formed.

Selected metal islands, e.g., gold islands, formed on the graphene may have a relatively uniform distribution as a deposition temperature is increased. Also, a portion of the metal particles is distributed on a grain boundary of the graphene. Accordingly, a shape of the nanostructure formed on the metal layer may be controlled by selecting the thickness of the metal layer. As the thickness of the metal layer is increased, the density and size of the metal islands are increased, and thus, the nanostructure is formed.

For example, as the thickness of the metal layer is increased from about 0.05 nm to about 1 nm, a volume of the nanostructure is increased by forming an alloy with the metal islands, and the nanowall is formed according to a network phenomenon with adjacent metal islands. Next, the nanowall is formed to a selected height, and then the nanowire starts to form, and thus, the hybrid nanostructure is eventually formed as the combination of the nanowall and the nanowire, and the nanowire are sequentially formed.

In an embodiment, the metal layer forms the island structure during the chemical deposition of the nanomaterial, and the island structure is formed along the grain boundaries of the graphene. In other words, the graphene has many grain boundaries that are interfaces where single crystals meet and thus have unstable energy. The island structure of the metal layer vibrates and moves by turning into a shape having a lower energy shape by thermal energy, and is located at the grain boundaries having unstable energy. Accordingly, a grain size of the graphene may be determined by measuring an average diameter of the island structures, and thus, suitable crystallization conditions to provide a single crystal of the graphene may be selected.

The nanomaterial used in the method according to an embodiment may be a Group IV semiconductor, such as C, Si, or Ge, a Group III-V semiconductor, a Group II-VI semiconductor, a Group IV-VI semiconductor, or a Group IV-V-VI semiconductor, an oxide semiconductor, such as ZnO, a nitride semiconductor, a metal, or a combination thereof. Representative Group III-V semiconductors include AlN, AlP, AlAs, AlSb, GaN, GaP, GaAs, GaSb, InN, InP, InAs, and InSb. Representative Group II-VI semiconductors include ZnS, ZnSe, ZnTe, CdS, CdSe, CdTe, HgS, HgSe, and HgTe. Representative Group IV-VI semiconductors include PbS, PbSe, and PbTe. The Group IV-V-VI semiconductor may be a ternary phase comprising Si, Ge, Sn, or Pb; P, As, Sb, or Bi; and S, Se, or Te. Representative oxide semiconductors include ZnO, $SnO_2$, indium zinc oxide, and gallium indium zinc oxide. Representative nitride semiconductors include Group III-V nitrides such as GaN, AlN, and InN, and ternary nitrides such as AlGaN, InGaN, and AlInN. The metal can be a metal of Groups 10 or 11. However, the nanomaterial is not limited thereto, and may be another suitable material that provides suitable chemical and physical properties. Also, the nanomaterial may have a heterostructure, where materials having different components are combined. For example, a heterostructure may comprise different shapes in a radius direction or a length direction.

According to another embodiment, a composite nanostructure including: a substrate; a graphene layer formed on the substrate; and a hybrid nanostructure formed on the graphene layer and including a nanowall structure and a nanowire structure, is provided.

The composite nanostructure may further include a metal layer, e.g., a gold layer, between the graphene layer and the hybrid nanostructure.

The hybrid nanostructure in the composite nanostructure may include a nanowall, a combination of a nanowall and a nanowire, and a nanowire in the stated order from the graphene layer.

According to another embodiment, a nanoelectronic device including the composite nanostructure is provided.

The nanoelectronic device may further include a counter electrode layer on the composite nanostructure. In an embodiment, a plurality of counter electrodes are spaced apart on the composite nanostructure. The counter electrode layer may comprise a material suitable for use as an electrode, such as graphene, indium tin oxide ("ITO"), Au, Pt, or indium zinc tin oxide ("IZTO").

The substrate in the nanoelectronic device may comprise a transparent polyethylene naphthalate ("PEN") substrate, a $SiO_2$ substrate, or an $Al_2O_3$ substrate.

The nanoelectronic device according to an embodiment may be a nanogenerator having a direct current ("DC") mode.

When a force is applied to the nanostructure forming the nanoelectronic device, electrons on the upper portion of the nanostructure move to the lower portion of the nanostructure, and in the nanostructure only formed of a nanowire, when the force is removed, the electrons present at the lower portion of the nanostructure return to the upper portion of the nanostructure. Thus a nanostructure able to operate in an alternating current ("AC") mode may be formed. However, if a nanowall is present at the lower portion of the nanostructure, as is present in an embodiment, the electrons which moved from the upper portion to the lower portion do not accumulate but move to the upper portion of the nanostructure, and thus the nanogenerator able to operate in the DC mode may be formed.

The embodiments will be described in greater detail with reference to the following examples. The following examples are for illustrative purposes only and are not intended to limit the scope of the present disclosure.

Example 1

Preparation of Graphene Sheet on Substrate

A Cu foil (bought from: Wacopa, thickness: 0.2 mm) was placed in a chamber (manufacturer: Kiln & Furnaces Tech. Co., Ltd, model no.: High Temp. Furnace 14030FL), and a mixed gas (methane:hydrogen=2:1) was uniformly injected into the chamber at a rate of 30 standard cubic centimeter per minute ("sccm") while thermally processing the chamber for 30 minutes at 1000° C. using a halogen lamp as a thermal source, thereby forming a graphene on the Cu foil.

Then, in order to separate the graphene from the Cu foil, a chlorobenzene solution in which poly(methyl methacrylate) ("PMMA") is dissolved was coated on the graphene/Cu foil at a rate of 1,000 revolutions per minute ("rpm") for 60 seconds, and then the resulting product was dipped in an etchant ($CuSO_4$+HCl+FeCl) solution (bought from: TRANSENE COMPANY Inc., product name: Nickel Etchant type 1). After 1 hour, the Cu foil was removed to separate the graphene adhered on the PMMA. The graphene adhered on the PMMA was transferred to an $Al_2O_3$ layer and dried, and then the PMMA was removed by using acetone. The transferring process was repeated 3 times to obtain a graphene trilayer.

Formation of Gold (Au) Metal Layer (Thickness: 0.5 nm) on Graphene/$Al_2O_3$

A gold metal source was charged to a lower portion inside a chamber of a thermal evaporation device (manufacturer: Sntek), and a graphene/$Al_2O_3$ substrate was provided at an upper portion. After the graphene/$Al_2O_3$ substrate and the source were provided, the inside of the chamber evacuated to provide a high vacuum of $1\times10^{-5}$ torr or a low vacuum of $1\times10^{-3}$ torr. Heat was applied to the gold in the lower portion to evaporate the gold under the high vacuum of $1\times10^{-5}$ torr, and then the evaporated gold was deposited on the graphene/$Al_2O_3$ substrate. A thickness of a gold metal layer formed on the graphene/$Al_2O_3$ substrate was selected to be 0.5 nm by using a sensor monitor installed in the thermal evaporation device.

Formation of ZnO Hybrid Nanostructure

A mixed power in which zinc oxide and graphite are mixed is charged to the center of the chamber, and then the gold/graphene/$Al_2O_3$ substrate prepared above was located at a location about 1 cm below the mixed powder. When the mixed powder and the gold/graphene/$Al_2O_3$ substrate are set in the chamber, a temperature of the chamber was increased under an atmosphere of an inert gas (Ar gas, supply rate: 1000 sccm). Here, chemical deposition was performed for 60 minutes at around 900° C.

Example 2

A ZnO hybrid nanostructure was formed in the same manner as in Example 1, except that the thickness of the gold metal layer was 1.0 nm instead of 0.5 nm.

Example 3

A ZnO hybrid nanostructure was formed in the same manner as in Example 1, except that the thickness of the gold metal layer was 2.0 nm instead of 0.5 nm.

Figure 2A:
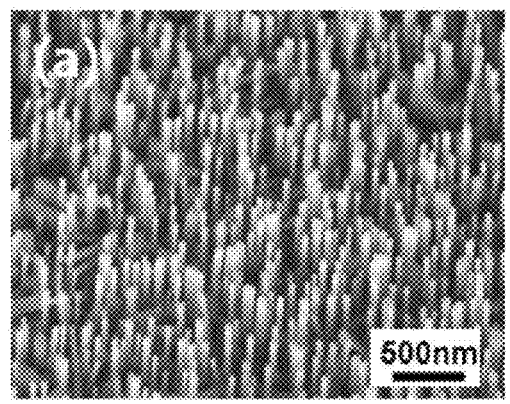
FIGS. 2A through 2C are field emission scanning electron micrographs ("FE-SEMs") of hybrid nanostructures prepared in Examples 1 through 3.
Figure 2B:
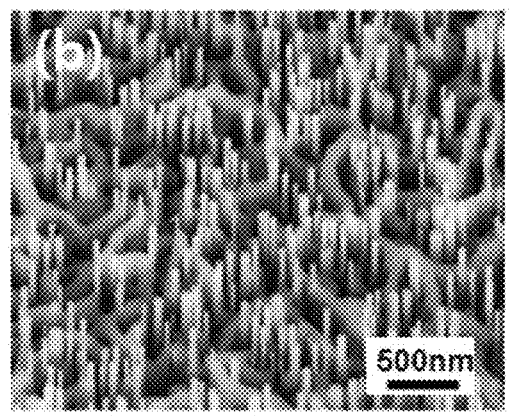
Figure 2C:
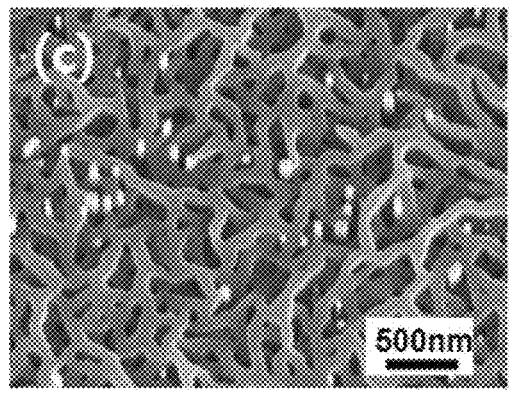

FIGS. 2A through 2C are field emission scanning electron micrographs ("FE-SEMs") of hybrid nanostructures prepared in Examples 1 through 3, respectively.

Figure 3A:
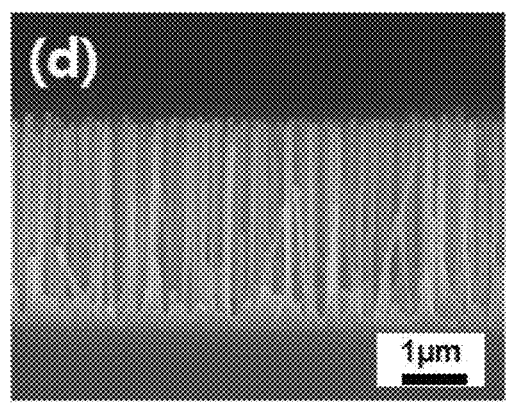
FIGS. 3A through 3C are FE-SEMs of cross sections of the hybrid nanostructures of Examples 1 through 3, respectively.
Figure 3B:
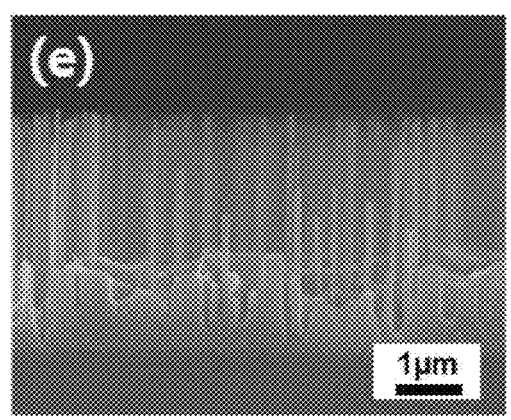
Figure 3C:
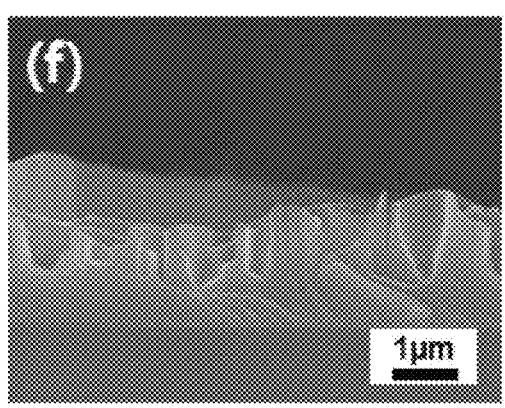

FIGS. 3A through 3C are FE-SEMs of cross sections of the hybrid nanostructures of Examples 1 through 3, respectively.

As shown in FIGS. 2 and 3, the morphology of a hybrid nanostructure depends on the thickness of the gold metal layer. In other words, as the thickness of the gold metal layer is increased, a size of an island structure of gold is increased, and thus, a diameter of a nanostructure grown on the island structure is also increased. Accordingly, adjacent nanostructures are combined, and thus, a number of nanowall structures is relatively higher than a number of nanowire structures. However, the hybrid nanostructures of Examples 1 through 3 each include a nanowall, a combination of a nanowall and a nanowire, and a nanowire in the stated order from a graphene layer.

Figure 4A:
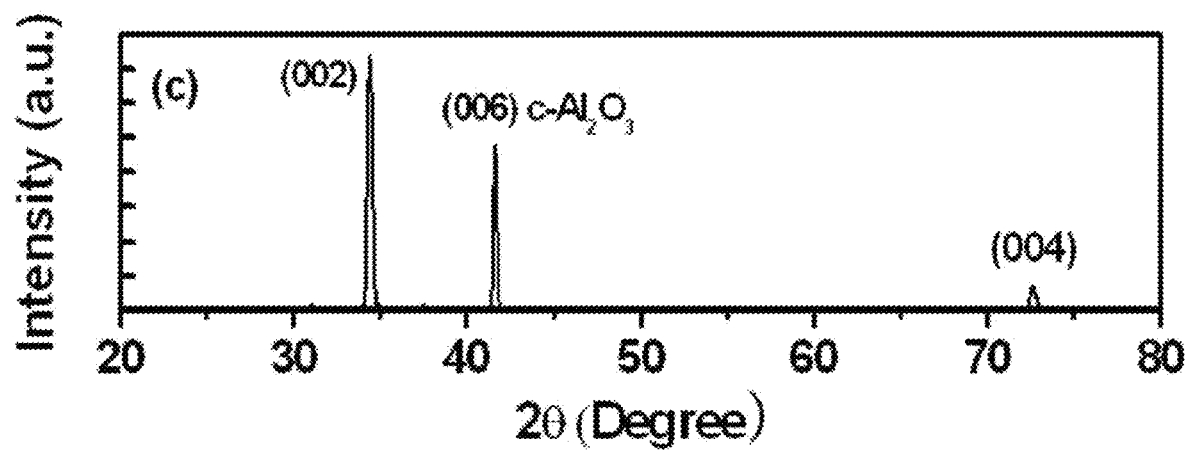
FIGS. 4A through 4C are graphs of intensity (arbitrary units, a.u.) versus scattering angle (degrees two-theta, 2θ) showing X-ray diffraction ("XRD") patterns of composite nanostructures including the hybrid nanostructures of Examples 1 through 3, respectively.
Figure 4B:
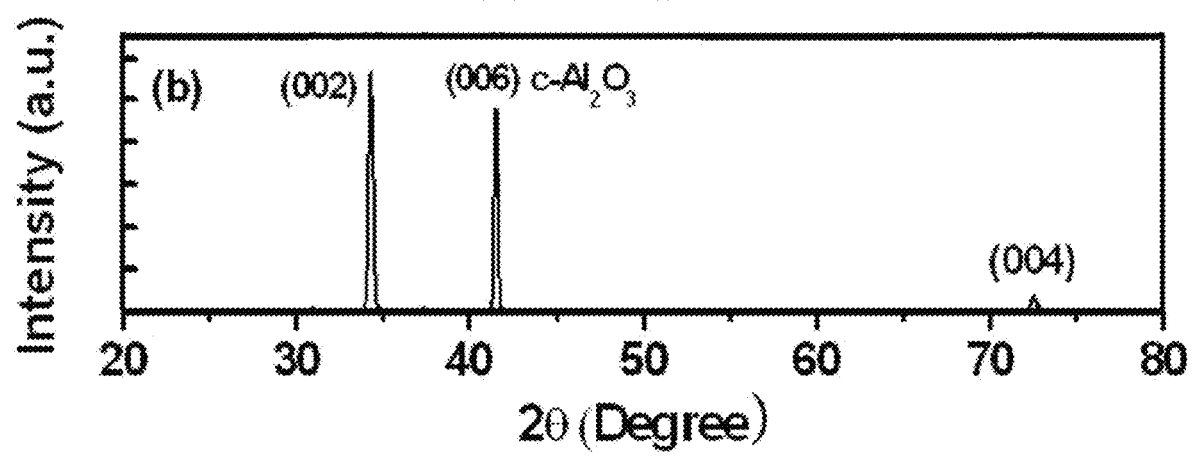
Figure 4C:
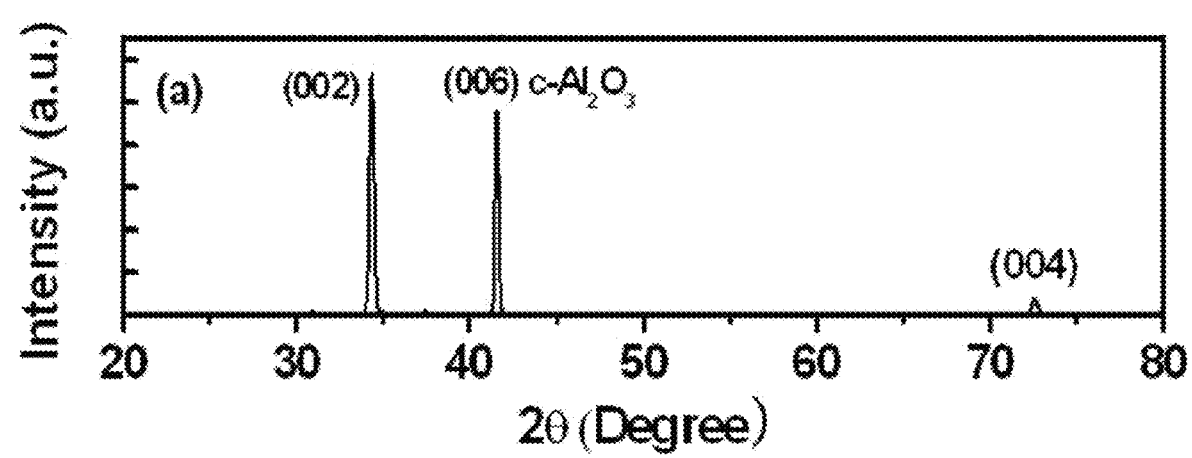
Figure 5A:
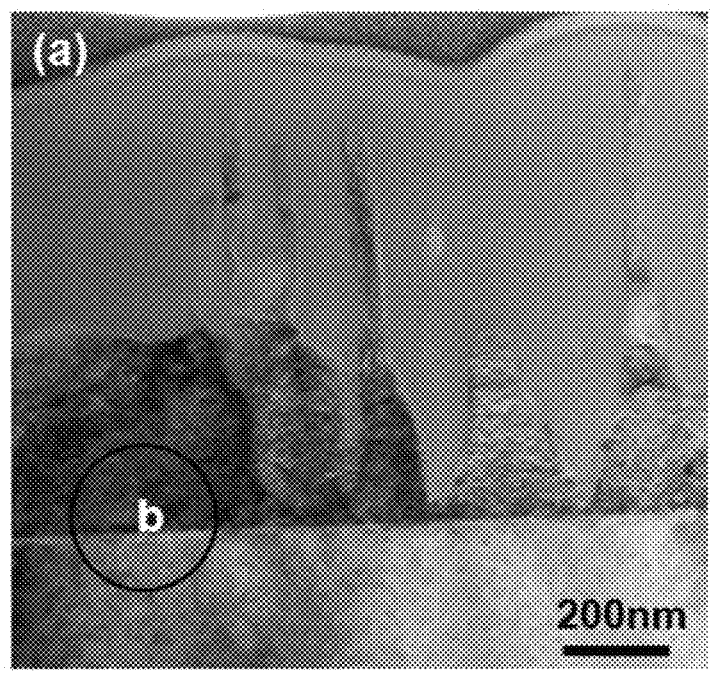
FIGS. 5A through 5D are high resolution transmission electron micrographs ("HR-TEMs") of the composite nanostructure including the hybrid nanostructure of Example 2.
Figure 5B:
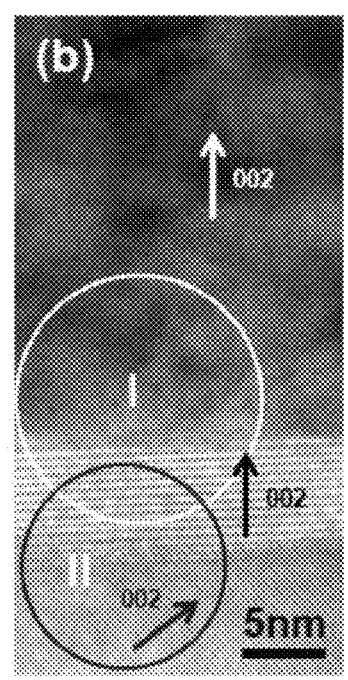
Figure 5C:
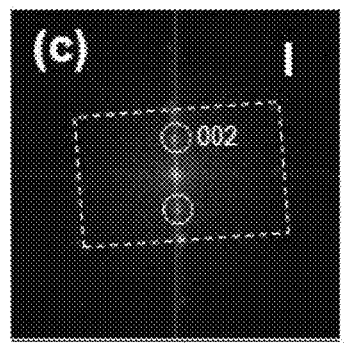
Figure 5D:
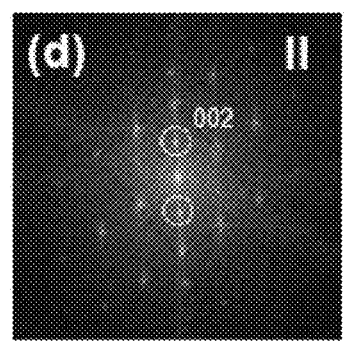

FIGS. 4A through 4C are X-ray diffraction ("XRD") patterns of composite nanostructures including the hybrid nanostructures of Examples 1 through 3, respectively. As shown in FIGS. 4A to 4C, the intensity of the 002 reflection indicates that the nanowire of the hybrid structure according to an embodiment is grown in a perpendicular (e.g., 002) direction with respect to the graphene layer. In other words, according to an embodiment of a method of forming a hybrid nanostructure, a nanoelectronic device having suitably stable electrical characteristics may be obtained by controlling a nanowire so that it grows perpendicular to a substrate.

FIGS. 5A through 5D are high resolution transmission electron micrographs ("HR-TEMs") of the composite nanostructure including the hybrid nanostructure of Example 2.

As shown in FIGS. 5A through 5D, graphene is formed on an $Al_2O_3$ substrate, and a ZnO hybrid structure is grown thereon. Also, ZnO is grown in the same direction as a growth direction of the graphene, i.e., the perpendicular 002 direction.

Also, nanoelectronic devices are manufactured using the hybrid nanostructure of Examples 1 through 3 and Comparative Examples 1 and 2.

An upper substrate and a lower substrate of the nanoelectronic device are fixed using a glue gun, wires are connected to the upper and lower electrodes to electrically connect the nanoelectronic device to a measuring device, the upper and lower electrodes are fixed to the wires using the glue gun, and then a silver (Ag) paste is used to combine the wires and the upper and lower electrodes to provide suitable electrical conductivity. The nanoelectronic device has a structure of the $Al_2O_3$ substrate and the graphene/ZnO hybrid nanostructure/gold metal layer/flexible substrate.

A switching polarity test was performed on the nanoelectronic devices. The switching polarity test was performed to determine operational characteristics of the electronic device. Because a signal output from the electronic device was very small, the switching polarity test was performed to determine whether a measured output value was just a value received from the outside (e.g., noise) or was generated by operation of the electronic device. The switching polarity test was performed by determining whether an output direction changes when the polarity of the electric device is switched.

Figure 6A:
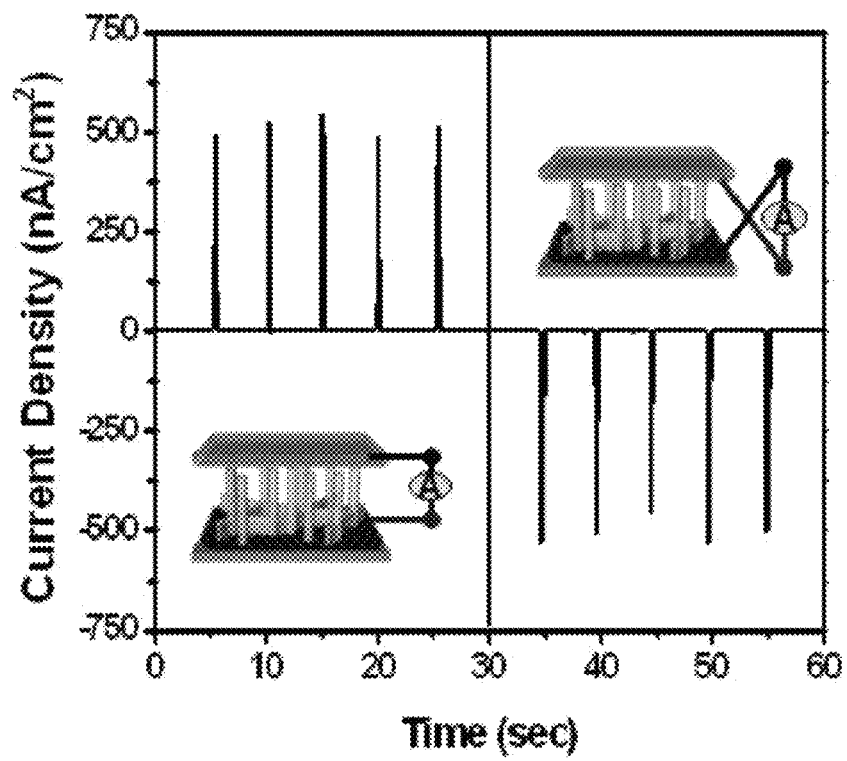
FIG. 6A is a graph of current density (nanoamps per square centimeter, nA/cm$^2$) versus time (seconds, sec) and 6B is a graph of voltage (millivolts, mV) versus time (seconds, sec), respectively showing variations of a current density and voltage versus time of a nanoelectronic device including the hybrid nanostructure of Example 2.
Figure 6B:
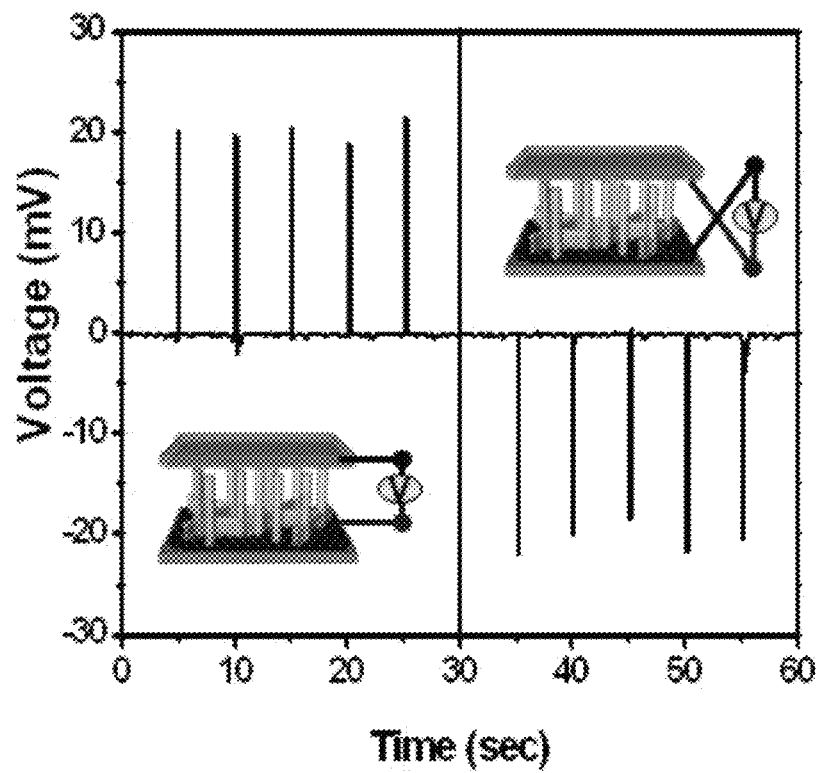

FIGS. 6A and 6B are graphs showing results of the switching polarity test of the nanoelectronic device of Example 2.

As shown in FIGS. 6A and 6B, a current density and voltage in a DC mode are shown.

Figure 7A:
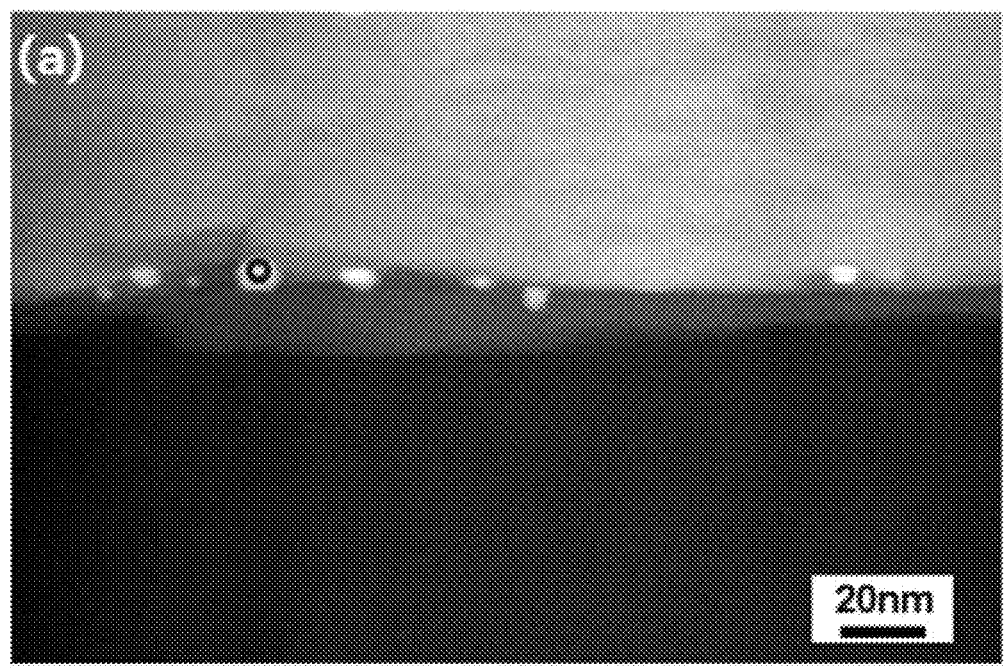
FIGS. 7A and 7B are respectively an HR-TEM and a micro-energy dispersive spectroscopy ("μ-EDS") spectrum, which is a graph of counts versus energy (kiloelectron volts, keV), of the hybrid nanostructure of Example 2.
Figure 7B:
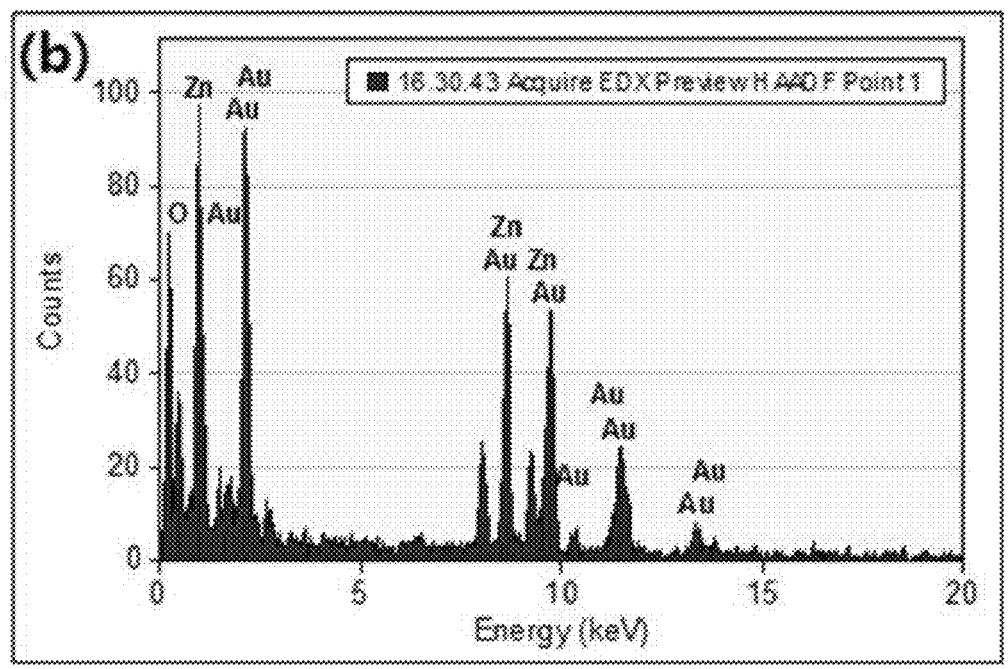

FIGS. 7A and 7B are respectively an HR-TEM and a micro-energy dispersive spectroscopy ("µ-EDS") spectrum of the hybrid nanostructure of Example 2. As shown in FIG. 7, the Au (metal catalyst) is disposed on graphene.

According to an embodiment, a nanoelectronic device having stable electrical characteristics and capable of operating in a DC mode may be obtained by controlling the morphology of a hybrid nanostructure while selecting a thickness of a metal layer, e.g., a gold metal layer, to a selected range.

As described above, according to an embodiment, a nanoelectronic device that operates in a DC mode can be obtained by efficiently controlling the morphology of a nanostructure to form a desired hybrid nanostructure on graphene.

It should be understood that the exemplary embodiments described herein should be considered in a descriptive sense only and not for purposes of limitation. Descriptions of features, advantages, or aspects within each embodiment should be considered as available for other similar features, advantages or aspects in other embodiments.

What is claimed is:

1. A method of forming a hybrid nanostructure on graphene, the method comprising:
    providing a graphene layer on a substrate;
    forming a metal layer on the graphene layer; and
    chemically depositing a nanomaterial on the graphene layer on which the metal layer is formed to form the hybrid nanostructure,
    wherein the nanomaterial is a ternary phase comprising Si, Ge, Sn or Pb; P, As, Sb or Bi;
    and S, Se or Te; $VO_2$, indium zinc oxide, gallium indium zinc oxide, AlInN, a metal of Group 10, or a combination thereof, and wherein the hybrid nanostructure comprises a nanowall, a combination of a nanowall and a nanowire, and a nanowire in the stated order from the graphene layer.

2. The method of claim 1, wherein the forming of the graphene layer comprises:
growing the graphene layer on a catalyst layer via chemical deposition;
removing the catalyst layer from the graphene layer; and
transferring the graphene layer to the substrate.

3. The method of claim 1, wherein a thickness of the metal layer is from about 0.5 nanometers to about 5 nanometers.

4. The method of claim 1, wherein the metal layer consists of gold.

5. The method of claim 1, wherein the nanomaterial is chemically deposited for about 30 minutes to about 2 hours at about 800 to about 950° C.

6. The method of claim 1, wherein a thickness of the formed metal layer is effective to selectively grow a nanowall or a nanowire.

7. The method of claim 1, wherein a structure of the metal layer is converted to an island structure when the nanomaterial is chemically deposited.

8. A composite nanostructure comprising:
a substrate;
a graphene layer formed on the substrate; and
a hybrid nanostructure formed on the graphene layer and comprising a combination of a nanowall and a nanowire,
wherein the nanowall and the nanowire comprise a ternary phase comprising Si, Ge, Sn or Pb; P, As, Sb or Bi; and S, Se or Te; $VO_2$, indium zinc oxide, gallium indium zinc oxide, AlInN, a metal of Group 10, or a combination thereof.

9. The composite nanostructure of claim 8, further comprising a metal layer between the graphene layer and the nanostructure, wherein the metal layer has an island structure.

10. The composite nanostructure of claim 9, wherein the metal layer consists of gold.

11. The composite nanostructure of claim 8, wherein the hybrid nanostructure comprises the nanowall, a combination of the nanowall and the nanowire, and the nanowire in the stated order from the substrate.

12. The composite nanostructure of claim 8, wherein the substrate is transparent and comprises polyethylene naphthalate, silicon oxide, aluminum oxide, or a combination thereof.

13. A nanoelectronic device comprising the composite nanostructure according to claim 8.

14. The nanoelectronic device of claim 13, further comprising a counter electrode layer spaced apart from the hybrid nanostructure.

15. The nanoelectronic device of claim 14, wherein the counter electrode layer comprises graphene, indium tin oxide, gold, platinum, indium zinc tin oxide, or combination thereof.

16. The nanoelectronic device of claim 13, wherein the nanoelectronic device is a direct current nanogenerator.

17. A hybrid nanostructure comprising:
a nanowall; and
a nanowire abutting the nanowall,
wherein the nanowall and the nanowire comprise a ternary phase comprising Si, Ge, Sn or Pb; P, As, Sb or Bi; and S, Se or Te; $VO_2$, indium zinc oxide, gallium indium zinc oxide, AlInN, a metal of Group 10, or a combination thereof; and
wherein a thickness of the nanowall is about 5 to about 100 nm and a diameter of the nanowire is about 5 to about 100 nm.

18. The hybrid nanostructure of claim 17, further comprising a combination of the nanowall and the nanowire between both the nanowall and the nanowire,
wherein the combination comprises a ternary phase comprising Si, Ge, Sn or Pb; P, As, Sb or Bi; and S, Se or Te; $VO_2$, indium zinc oxide, gallium indium zinc oxide, AlInN, a metal of Group 10, or a combination thereof.

19. The hybrid nanostructure of claim 17, wherein
the nanowall has a height of about 1 to about 100 μm,
the nanowire has a length of about 1 to about 100 μm, and
a direction of the height of the nanowall and a direction of the length of the nanowire are parallel.

20. A method of forming a hybrid nanostructure on graphene, the method comprising:
providing a graphene layer on a substrate;
forming a metal layer on the graphene layer; and
chemically depositing a nanomaterial on the graphene layer on which the metal layer is formed to form the hybrid nanostructure,
wherein the nanomaterial comprises a ternary phase comprising Si, Ge, Sn or Pb; P, As, Sb or Bi; and S, Se or Te; $VO_2$, indium zinc oxide, gallium indium zinc oxide, AlInN, or a metal of Group 10, and
wherein the hybrid nanostructure comprises a nanowall, a combination of a nanowall and a nanowire, and a nanowire in the stated order from the graphene layer.

* * * * *